United States Patent [19]
Chou

[11] Patent Number: 6,116,492
[45] Date of Patent: Sep. 12, 2000

[54] JIG FOR FACILITATING SURFACE-SOLDERING PIN TO LAMINATED METAL SHEET

[75] Inventor: Ming-Ching Chou, Chang-Hua, Taiwan

[73] Assignee: Behavior Tech Computer Corporation, Taipei, Taiwan

[21] Appl. No.: 09/300,831

[22] Filed: Apr. 28, 1999

[51] Int. Cl.$^7$ .................................................. B23K 37/00
[52] U.S. Cl. ............................................ 228/44.3; 29/842
[58] Field of Search .................................. 228/44.3, 212, 228/44.7, 49.5; 29/281.1, 842; 361/751; 269/903

[56] References Cited

U.S. PATENT DOCUMENTS

| | | | |
|---|---|---|---|
| 3,395,439 | 8/1968 | Palesi et al. | 29/203 |
| 3,963,456 | 6/1976 | Tsuchiya et al. | 29/203 B |
| 4,203,698 | 5/1980 | Dupuis | 414/404 |
| 4,255,077 | 3/1981 | Smith | 414/786 |
| 4,516,318 | 5/1985 | Kirschenmann | 29/846 |
| 4,767,984 | 8/1988 | Bakker | 324/158 F |
| 4,799,659 | 1/1989 | Donovan | 269/289 R |
| 4,965,227 | 10/1990 | Chang et al. | 437/207 |
| 5,692,297 | 12/1997 | Noda | 29/845 |
| 5,722,579 | 3/1998 | Yu et al. | 228/119 |
| 5,850,691 | 12/1998 | Bell | 29/845 |
| 5,951,803 | 9/1999 | Johnston | 156/233 |

Primary Examiner—Patrick Ryan
Assistant Examiner—L. Edmondson
Attorney, Agent, or Firm—Rosenberg, Klein & Lee

[57] ABSTRACT

A jig for facilitating soldering of elongate pin to a circuit board having laminated first and second layers of metal in predetermined areas is provided and includes a template supported above the circuit board and at least one support frame supported above the template and the circuit board. The template includes legs descending therefrom which define a space therebetween for snugly receiving the circuit board therein. The template has pin receiving holes formed therethrough in respective alignment with the predetermined areas of the circuit board for the elongate pins to extend therethrough to contact the predetermined areas of the circuit board. The support frame includes pin position adjusting sections resiliently extending laterally therefrom and respectively having pin retaining holes formed therein in correspondence to the pin receiving holes of the template. Each pin position adjusting section has a leg depending therefrom and extending through a corresponding anchoring hole of the template for mounting the template to the support frame. Each leg also has a lower end extension which tightly fit into holes formed in the predetermined areas of the circuit board. By that arrangement, the lower end extensions of the legs securely fix the metal layers together during the soldering process and positional variations of elongate pins are accommodated by the resiliency of the pin position adjusting sections.

2 Claims, 2 Drawing Sheets

JIG FOR FACILITATING SURFACE-SOLDERING PIN TO LAMINATED METAL SHEET

FIELD OF INVENTION

The present invention generally relates to a jig for facilitating surface-soldering elongate pins to a laminated metal sheet comprising at least two layers of different metals having different thermal expansion coefficients.

BACKGROUND Of THE INVENTION

Electrical circuit boards are widely adapted in various fields of electrical and electronic devices. An electrical circuit board comprises a dielectric substrate with at least two layers of different metals coated on a surface thereof for connecting electronic elements and/or electrical devices. FIG. 4 shows a typical example of an element soldered to the metal layers of the circuit board. The circuit board comprises a dielectric substrate A with two layers A2, A3 of different metals, such as aluminum and copper, coated on a surface thereof. An elongate pin A1 is soldered to the metal layers A2, A3. Such a pin A1 is usually for testing purposes and has an expanded base that is not suitable for being secured to the circuit board by means of through hole technique. In stead, surface-mounting type soldering technique must be employed.

When soldering the pin A1 to the top metal layer A2, a substantial amount of heat is applied to the metal layers A2, A3. Since the layers A2, A3 are made of different metals, they have different thermal expansion coefficients resulting in different amounts of expansion during the soldering process. Consequently, the layers A2, A3 are delaminated and the pin A1 inclines and even separates from the circuit board.

Thus it is desirable to have a jig for facilitating surface soldering of an elongate article to a laminated metal sheet to eliminate the problems discussed above.

SUMMARY OF THE INVENTION

Accordingly, an object of the present invention is to provide a jig for facilitating surface-soldering an elongated article to a laminated metal sheet of a circuit board thereby eliminating delamination of the metal sheet.

Another object of the present invention is to provide a jib for securely retaining an elongate article to a circuit board when surface-soldering the elongate article to a laminated metal sheet coated on the circuit board.

To achieve the above objects, in accordance with the present invention, there is provided a jig comprising a template supported above the metal sheet and at least one support frame. The template has depending projections defining a space therebetween for snugly receiving the metal sheet therein. Pin receiving holes are defined in the template for receiving the elongate pins therein. The support frame is supported above the template and the metal sheet and includes pin position adjusting sections resiliently extending therefrom with pin retaining holes defined therein corresponding to the pin receiving holes of the template for receiving and retaining the pins with lower ends of the pins contacting the metal sheet. Each pin position adjusting section has a leg depending therefrom and extending through a corresponding anchoring hole defined in the template plate for mounting the template to the support frame. Each leg has a lower end extension tightly fit into a hole defined in the metal sheet. The hole extends through all the metal layers whereby the lower end extension securely fixes the metal layers together during a soldering process and a positional variation of the pins is accommodated by the resiliency of the pin position adjusting sections.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
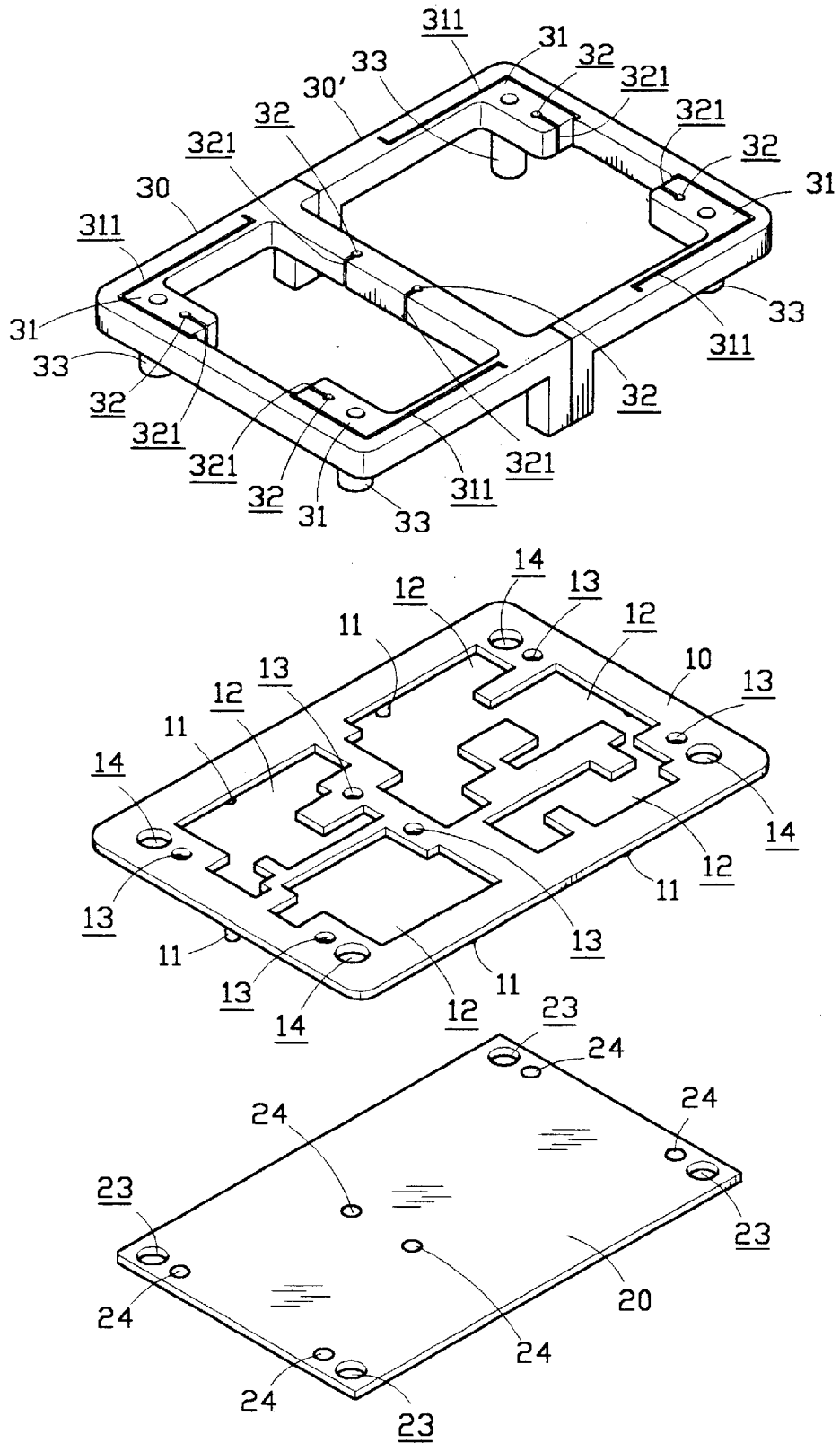
FIG. 1 is an exploded view of a jig constructed in accordance with the present invention and a laminated metal sheet to which an elongate pin is to be surface-soldered with the aid of the present invention.
Figure 2:
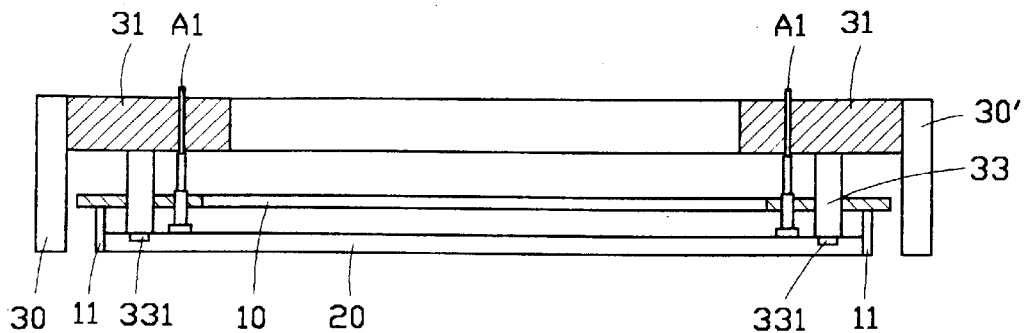
FIG. 2 is a cross-sectional view of FIG. 1.

With reference to the drawings and in particular to FIGS. 1 and 2, wherein a jig for facilitating surface-soldering an elongate pin A1 to a laminated metal sheet 20 is shown, the jig of the present invention comprises a template 10 patterned corresponding to the laminated metal sheet 20 for being positioned thereabove and at least one support frame 30, 30'. The template 10 has a plurality of legs 11 depending therefrom defining a space therebetween for accommodating the metal sheet 20 therein thereby properly positioning the template 10 with respect to the metal sheet 20. The template 10 defines openings 12 therein for providing space for accommodating devices/elements or articles to be soldered to the metal sheet 20. The template 10 further defines a plurality of pin receiving holes 13 for receiving and temporarily retaining elongate pins A1 to be surface-soldered to the metal sheet 20. Bores 14 are also defined in the template 10.

Figure 3:
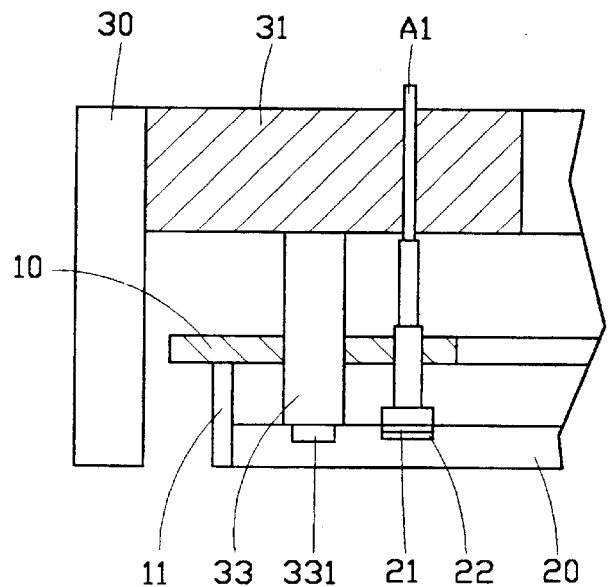
FIG. 3 is an expanded view of a portion of FIG. 2.
Figure 4:
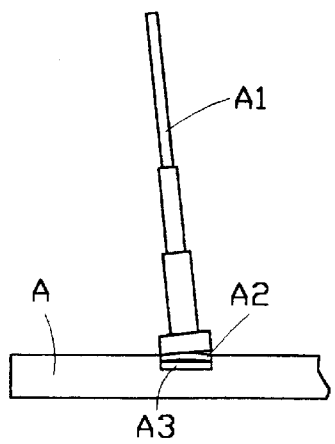
FIG. 4 is a schematic view showing an elongate pin surface-soldered to a laminated metal sheet coated on a circuit board.

The metal sheet 20 may be an individual sheet made of at least two layers of metals stacked on each other or preferably, a laminated metal sheet coated on a surface, such as a circuit board, as a preferred embodiment of the present invention. The metal sheet 20 comprises a first layer of metal 21 and a second layer of metal 22 having different thermal expansion coefficients as shown in FIG. 3. A plurality of holes 23 are defined therein corresponding to the bores 14 of the template 10. A plurality of soldering areas 24 are formed on the metal sheet 20 corresponding to the pin receiving holes 13 of the template 10. The soldering areas 24 are dimensioned corresponding to the article to be soldered to the metal sheet 20. An etching process is carried on the metal sheet 20 to remove the layers of metals 21, 22 except the soldering areas 24.

In the embodiment illustrated, two support frames 30, 30' are incorporated, which are configured corresponding to the template 10 and the metal sheet 20. Each support frame 30, 30' comprises a plurality of legs for supporting the frame 30, 30' above the template 10 and the metal sheet 20. Each support frame 30, 30' comprises at least one pin position adjusting section 31 which resiliently extends from the support frame 30, 30 with a slit 311 formed therebetween for accommodating minute deformation and deflection of the pin position adjusting section 31 with respect to the support frame 30, 30'. In the embodiment illustrated, each support frame 30, 30' has two pin position adjusting sections 31. Each pin position adjusting section 31 defines a pin retaining hole 32 corresponding to the pin receiving holes 13 of the template 10. The elongate pins A1 are inserted through and retained in the pin retaining holes 32, as shown in FIG. 2. Each pin retaining hole 32 has a radially-extending slit 321 for facilitating deformation of the hole 32 when the pin A1 is inserted therein and for accommodating minute positional variation of the pin A1. If desired, there may be additional pin retaining holes 32 defined in portions of the support frame 30, 30' other than the pin position adjusting sections 31.

Each pin position adjusting section 31 of the support frame 30, 30' comprises an anchoring bar 33 extending through the corresponding bore 14 of the template 10 and having a lower end extensions 331 (see Fig. 2) tightly fit in corresponding holes 23 defined in the metal sheet 20 for properly positioning the support frame 30, 30' with respect to the template 10 and the metal sheet 20 and for securely fixing the metal sheet 20 to the support frame 30, 30'. The hole 23 of the metal sheet 20 extend through both the first metal layer 21 and the second metal layer 22 whereby the insertion of the lower end extension 331 of the anchoring bar 33 in the hole 23 effectively fixes the first and second metal layers 21, 22 together at least at portions around the holes 23. Thus the two metal layers 21, 22 undergo substantially the same amount of displacement or deformation during a soldering process.

FIG. 3 shows an application of the present invention. In a practical operation, the template 10 is mounted to the support frames 30, 30' by inserting the anchoring bars 33 of the support frames 30, 30' through the bores 14 of the template 10. The pins A1 are inserted through the pin receiving holes 13 of the template 10 and into the pin retaining holes 32 of the support frames 30, 30'. The support frames 30, 30' are then mounted to the metal sheet 20 by inserting the lower end extensions 31 of the anchoring bars 33 thereof into the holes 23 of the metal sheet 20 with the pins A1 contacting the metal sheet 20. The first and second metal layers 21, 22 are securely fixed together by the legs 33. The displacement thereof caused by heat of a soldering process is accommodated by deformation and/or deflection of the pin position adjusting sections 31 of the support frames 30, 30'. Thus, the pins A1 retained in the pin retaining holes 32 are firmly retained on the metal sheet 20 during the soldering process. Inclination of the pins A1 or delamination of the metal layers 21, 22 is effectively eliminated.

Although it has been described that the metal sheet 20 is coated on a circuit board, it is apparent that the present invention may also be employed in other applications, such as welding an elongate bar to a laminated metal plate.

Although the present invention has been described with respect to a preferred embodiment, it is contemplated that a variety of modifications, variations and substitutions may be done without departing from the scope of the present invention that is intended to be defined by the appended claims.

What is claimed is:

1. A jig for facilitating soldering elongate pins to a circuit board having at least first and second layers of metal laminated one upon the other in predetermined areas of the circuit board, the first and second layers of metal having different thermal expansion coefficients, the jig comprising:

a template supported above the circuit board, the template including legs depending therefrom and defining a space therebetween for snugly receiving the circuit board therein, the template having pin receiving holes formed therethrough in respective alignment with the predetermined areas of the circuit board, the elongate pins extending through the pin receiving holes to contact the predetermined areas of the circuit board, the template having a plurality of anchoring holes formed therethrough; and at least one support frame supported above the template and the circuit board, the support frame including pin position adjusting sections resiliently extending laterally therefrom and respectively having pin retaining holes formed therein in correspondence to the pin receiving holes of the template for receiving and retaining the elongate pins extending through the pin receiving holes of the template with lower ends of the elongate pins contacting the predetermined areas of the circuit board, each pin position adjusting section being separated from the support frame by a slit to form a deformable connection therebetween, each pin position adjusting section having a leg depending therefrom and extending through a corresponding anchoring hole of the template for mounting the template to the support frame, each leg having a lower end extension tightly fit into a hole formed in the predetermined areas of the circuit board, the hole extending through the first and second metal layers, whereby the lower end extension securely fixes the metal layers together and a positional variation of the elongate pins being accommodated by the resiliency of the pin position adjusting sections.

2. The jig as claimed in claim 1, wherein each of the pin retaining holes of the support frame comprises a raidally-extending slit for facilitating deformation of the pin retaining hole.

* * * * *